United States Patent
Leclerc et al.

(10) Patent No.: US 8,330,636 B2
(45) Date of Patent: Dec. 11, 2012

(54) LINE OF PROPAGATION DIGITIZING DEVICE

(75) Inventors: Pascal Leclerc, Orsay (FR); Nicolas Fel, Maisons Alfort (FR); Bernard Riondet, Vauhallan (FR)

(73) Assignees: Greenfield Technology, Massy (FR); Commissariat a l'Energie Atomique et aux Energies Alternatives, Paris (FR)

( * ) Notice: Subject to any disclaimer, the term of this patent is extended or adjusted under 35 U.S.C. 154(b) by 3 days.

(21) Appl. No.: 12/991,263

(22) PCT Filed: Apr. 29, 2009

(86) PCT No.: PCT/FR2009/050791
§ 371 (c)(1),
(2), (4) Date: Nov. 5, 2010

(87) PCT Pub. No.: WO2009/138694
PCT Pub. Date: Nov. 19, 2009

(65) Prior Publication Data
US 2011/0050469 A1  Mar. 3, 2011

(30) Foreign Application Priority Data
May 7, 2008  (FR) ..................... 08 53028

(51) Int. Cl.
*H03M 1/12* (2006.01)
(52) U.S. Cl. .................... 341/155; 341/122
(58) Field of Classification Search .............. 341/141, 341/155, 122, 172; 257/259
See application file for complete search history.

(56) References Cited

U.S. PATENT DOCUMENTS

| | | | |
|---|---|---|---|
| 4,353,057 A | 10/1982 | Bernet et al. | |
| 5,200,983 A | 4/1993 | Kogan | |
| 5,471,162 A | 11/1995 | McEwan | |
| 6,091,619 A | 7/2000 | Kogan | |
| 6,246,044 B1 | 6/2001 | Ghis | |
| 6,462,728 B1 * | 10/2002 | Janssen et al. | 345/100 |
| 6,680,606 B1 | 1/2004 | Ghis et al. | |
| 7,012,559 B1 * | 3/2006 | Pan et al. | 341/161 |

(Continued)

FOREIGN PATENT DOCUMENTS
EP    006779    5/1982
(Continued)

OTHER PUBLICATIONS

El Aabbaoui, Hassan, "Contribution a l'etude et a la realization d'un numberiseur ultra large bande a haute resolution en filieere TBH InP," Presentee a l'Universite des Sciences et Technologies de Lille, Mar. 2007, 167 pages.

(Continued)

*Primary Examiner* — Peguy Jean Pierre
(74) *Attorney, Agent, or Firm* — Brinks Hofer Gilson & Lione

(57) ABSTRACT

An electric signal digitizing device includes a line of propagation through which the signal travels and a plurality of samplers ($14_1, \ldots, 14_N$) connected at separate points on the line of propagation, such that each one samples the signal value at the connection point thereof. The device further includes an analog matrix memory including a line of which at least some elements are each connected to a sampler of the plurality of samplers to receive the value sampled by the sampler, and a means for the line-to-line shifting of stored values. An analog-digital conversion means is also provided for the analog-digital conversion of the stored values.

13 Claims, 3 Drawing Sheets

U.S. PATENT DOCUMENTS

| | | | |
|---|---|---|---|
| 7,352,309 B2 * | 4/2008 | Draxelmayr | 341/122 |
| 7,546,879 B2 * | 6/2009 | Cantin et al. | 166/334.4 |
| 7,570,293 B2 * | 8/2009 | Nakamura | 348/308 |
| 7,778,320 B2 * | 8/2010 | Agazzi et al. | 375/229 |
| 2008/0298109 A1 | 12/2008 | Breton et al. | |

FOREIGN PATENT DOCUMENTS

| | | |
|---|---|---|
| FR | 2 764 070 | 5/1997 |
| FR | 2 779 528 | 6/1998 |
| FR | 2 872 331 | 6/2004 |

OTHER PUBLICATIONS

Gorisse, Benoit, "Etude d'elements de base et de concepts pour un numeriseur a tres large bande passante et a haute resolution," Universite des Sciences et Technologies de Lille, Dec. 2007, 254 pages.

Nail, M. et al., "Electrical single-pulse optoelectronic sampling of X-ray photodetector signals," Nuclear Instruments and Methods in Physics Research A 380 (1996), pp. 358-360.

International Search Report Dated Mar. 12, 2009 (8pgs).

Gorisse et al., "*Jitter Analysis of Electrical Samplers Based on a Propagation Line*"—Microwave Conference—2007, European IEEE, PI, Oct. 1, 2007, (pp. 1668-1671).

Aabbaoui, et al., "*20GHz Bandwidth Digitizer for Single Shot Analysis*"—Circuits and Systems 2006., ISCAS 2006. Proceedings. 2006 IEEE International Symposium on, IEEE, Piscataway, NJ, USA, May 1, 2006, (pp. 2365-2368).

* cited by examiner

LINE OF PROPAGATION DIGITIZING DEVICE

PRIORITY CLAIM

This application is a nationalization under 35 U.S.C. 371 of PCT Application No. PCT/FR2009/050791, filed Apr. 29, 2009, which claims priority to French Patent Application No. 0853028, filed May 7, 2008, incorporated by reference herein.

TECHNICAL FIELD

The invention relates to a line of propagation digitizing device (or digitizer).

BACKGROUND

It has already been proposed, when it is desired to digitize very fast electric signals (for example for the acquisition of transitory signals or in the design of rapid oscilloscopes), to use the fact that the electric signal is propagated with a speed that is indeed very high but finite, and that it is possible therefore to gain access to the evolution of the electric signal in very short times by sampling the various values of this signal at different points of a line of propagation at a given moment, by means notably of ultra-fast track-and-hold units.

The values sampled by the track-and-hold units can then be read (and usually converted to digital form) off line.

Such a technique is for example described in U.S. Pat. No. 5,471,162 and French Patent No. 2 764 070 and makes it possible to obtain a large dynamic range of recording (more than 10 bits) and a very large bandwidth (greater than 10 GHz).

It is understood however that by using these principles the duration of acquisition of the signal is determined by the length of the line of propagation used for the acquisition (since these two magnitudes are linked, in an invariable manner, by the speed of the electric signal in the line, namely approximately 5 nanoseconds per meter) and that the desired increase in the duration of acquisition is consequently quickly problematical.

Because of this, a proposal has been made, in order to reduce the length of the line of propagation for a given acquisition period, to introduce a delay in the triggering (consequently successive) of the various track-and-hold units placed along the propagation line. Such a solution is for example described in patent application French Patent No. 2 779 528.

These various solutions also come up against the problem of the degradation of the signal when the number of track-and-hold units used along the line of propagation increases, which is however naturally also desirable in order to increase the number of samples acquired.

The solutions used in other fields of electric signal acquisition and the technologies used in these fields however seem to be incapable of meeting these requirements specific to the line of propagation digitizers mainly because of the necessary speed of the track-and-hold units and the simultaneity of their triggering (or of the virtual simultaneity when a delay is introduced between the various track-and-hold units). Specifically, these particular conditions imply, for example, the use of fast electronic technologies such as InP, AsGa or SiGe.

Other solutions have therefore been sought to increase the number of samples acquired by digitizers using a line of propagation such as, for example, the introduction of regenerating amplifiers between track-and-hold unit blocks (see, for example, "*Contribution à l'étude et à la réalisation d'un numériseur ultra large bande à haute résolution en filière HBT InP*" [Contribution to the design and production of an ultra broadband digitizer with high resolution in InP HBT process], the thesis of Hassan El Aabbaoui, Mar. 30, 2007, Université des sciences et technologies de Lille). These solutions are however quite awkward to apply in practice.

It has finally been proposed to use several propagation lines and to cause the line of propagation to function in repetitive mode and to multiplex several fast analog-digital converters behind the track-and-hold units (see for example "*Etude d'éléments de base et de concepts pour un numériseur à trés large bande passante et à haute résolution*" [Study of basic elements and of concepts for a very large bandwidth digitizer and at high resolution], the thesis of Benoit Gorisse, Dec. 14, 2007, Université des sciences et technologies de Lille). This solution however demands the use of fast converters, the characteristics of which, in particular in terms of the dynamic range of the converted signal, are not optimal.

In this context, the invention proposes a device for digitizing an electric signal, characterized in that it comprises a line of propagation over which the signal travels, a plurality of track-and-hold units connected at distinct points of the line of propagation so that each samples the value of the signal at its connection point, an analog matrix memory comprising a line of which at least certain elements are each connected to a track-and-hold unit so as to receive the value sampled by the track-and-hold unit, and means for line-to-line shifting of the stored values, and analog-digital conversion means for converting the stored values.

The multiplicity of the track-and-hold units allows each of them to work at a reduced frequency relative to the sampling frequency required for the whole system and the use of an analog matrix memory is therefore finally well suited to receiving in parallel the samples sampled on the propagation line.

The analog-digital conversion means comprise, for example, a plurality of analog-digital converters.

According to a first solution that may be envisaged, the analog-digital converters are each connected to a column of the analog matrix memory. It is therefore possible to read and convert the recorded values in columns at a slower pace than that of the sampling.

According to another solution that may be envisaged, an analog-digital converter is associated with each element of the analog memory, which makes it possible to continuously read the recorded values. The analog-digital converters are for example incorporated into the analog memory to do this.

It is possible to provide, in this context, means for controlling the shift at a determined frequency and means for controlling the converters at a frequency equal to said determined frequency divided by the number of elements in a column in the analog memory. The analog memory (by virtue of the plurality of elements in a column) therefore makes it possible to reduce the working frequency of the converters and notably, as a consequence, to use converters with large dynamic range.

Moreover, at least one track-and-hold unit may be connected to the analog memory by means of a differential amplifier so as to alternately apply the sampled value to a first column and to a second column of the analog memory, which makes it possible to divide by two the length of the line of propagation for a given number of samples sampled.

The track-and-hold units are for example made in InP technology, particularly suited to the necessary operating speed, while the analog memory can be made in CMOS technology, by virtue notably of the relatively low working frequency of the memory allowed by the presence of several track-and-hold units as already indicated. Also provided, for example, is a number of track-and-hold units of between 10 and 100, which allows a reduction of this working frequency by more than an order of magnitude, limiting however the length of the line to prevent the degradation of the signal.

BRIEF DESCRIPTION OF DRAWING

Other features and advantages of the invention will better appear on reading the following description given with reference to the appended drawings in which.

DETAILED DESCRIPTION

Figure 1:
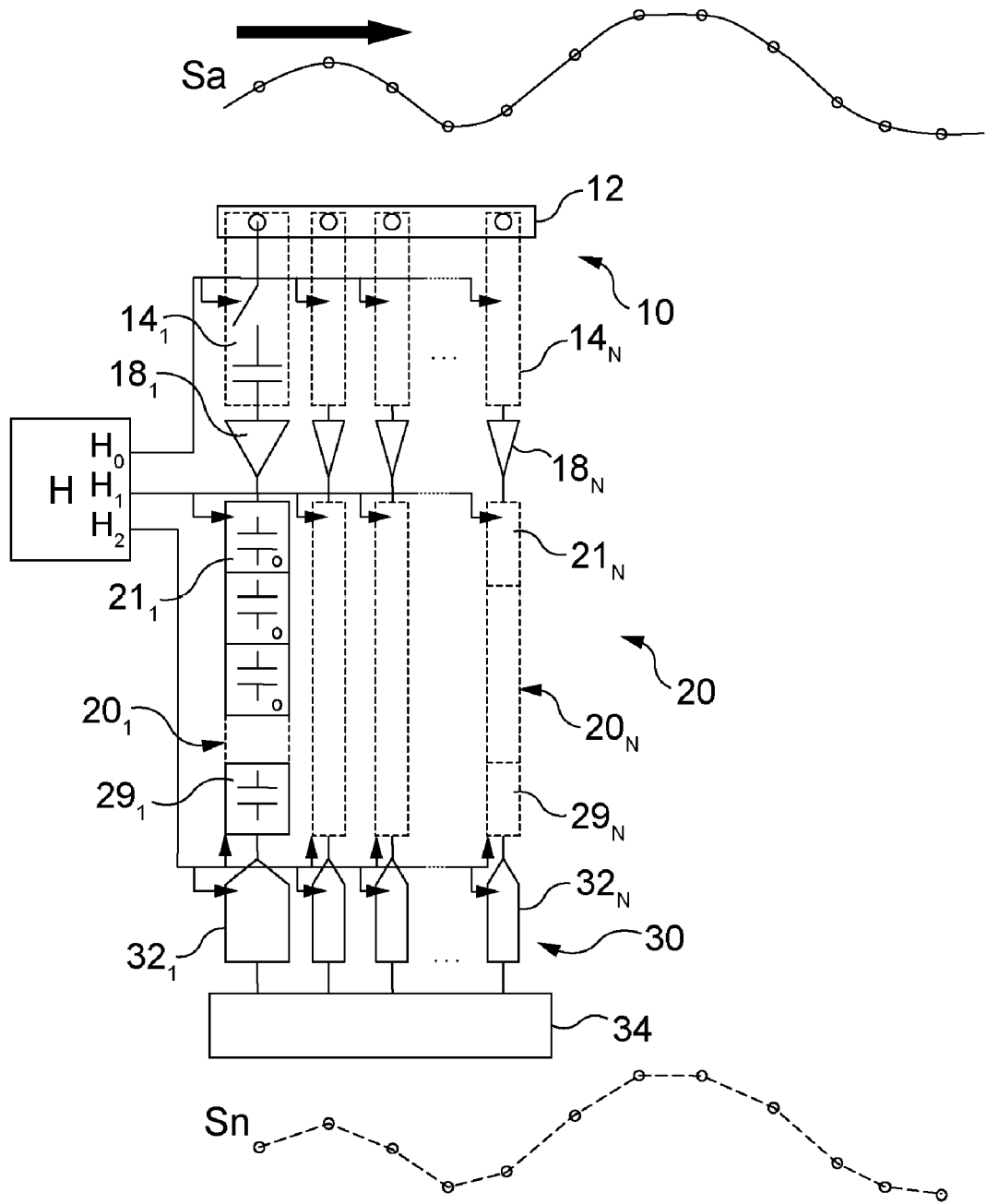
FIG. 1 represents a digitizer according to a first embodiment of the invention.

The digitizer shown in FIG. 1 is mainly formed of three stages 10, 20, 30 successively described below.

The first stage 10 comprises a line of propagation 12 on which N fast track-and-hold units $14_1, \ldots, 14_N$ are placed (in the example described here, N=20 for example). These track-and-hold units $14_1, \ldots, 14_N$ each sample the signal at a specific sampling frequency $f_e$ (in this instance, for example, $f_e$=1 GHz), which allows the system in its entirety to produce a sampling frequency $F_e = N.f_e$ (or in this instance 20 GHz).

As can be seen in FIG. 1, for this purpose a clock signal $H_0$ generated by a clock H at the frequency $f_e$ is applied, for example, in order to control the simultaneous sampling of N samples by the N track-and-hold units. As a variant, it would be possible to insert a delay between the various track-and-hold units so as to trigger them successively, which would make it possible to reduce the necessary length of the line of propagation for a given period of acquisition as already explained in the introduction.

This first stage is made in a fast technology such as InP, AsGa or SiGe. Used here, for example, is the InP technology, an HBT (meaning "Heterojunction Bipolar Transistor") method, at a high switching frequency (bandwidth of the order of 300 GHz) which makes it possible to ensure a sampling combining a large bandwidth and a large dynamic range.

Each track-and-hold unit $14_i$ can in practice be achieved at two levels: a very high-frequency and high-impedance track-and-hold unit, followed by a track-and-hold unit of lower frequency having a greater capacitance in order to keep the sample in memory for a longer period without signal loss.

The second stage 20 comprises a series of analog memories $20_1, \ldots, 20_N$ with sequential access which thus each form a column of an analog matrix memory. Each element $21_1, \ldots, 21_N$ of the first line of this matrix memory is connected (in this instance through an amplifier $18_1, \ldots, 18_N$) to a track-and-hold unit $14_1, \ldots, 14_N$ in order to receive and record the analog samples supplied by the first stage.

It is also possible to interpose between the first stage and the second stage (that is to say between the output of each track-and-hold unit $14_i$ and the input of the associated analog memory $20_i$) an antialiasing low-pass filter of a high order and with a cutoff frequency equal to the bandwidth of the analog memory.

The memories used may be of the CCD ("Charge Coupled Device") or FISO ("Fast In Slow Out") type and made in a CMOS or bi-CMOS technology (technologies that are less demanding in power consumption). Advantageously, the InP and CMOS technologies used here respectively for the first stage and the second stage have compatible electric levels and therefore interface without difficulty. The memories must also have an access time allowing the storage of the samples sampled by the first stage, namely in this instance an access time of 1 ns.

On each operating cycle throughout the period of acquisition, the values stored in the analog memories $20_1, \ldots, 20_N$ are shifted by one memory element (downward in FIG. 1), that is to say from line to line at the level of the matrix memory formed by all of the analog memories $20_1, \ldots, 20_N$. To do this, a clock signal $H_1$ is in this instance applied at the frequency $f_e$.

The depth of memory M (that is to say the number of memory elements of each analog memory $20_1, \ldots, 20_N$, or the number of lines of the matrix memory formed by all of these analog memories) thus determines the number M.N of samples recorded and the recording duration $T=M/f_e$. In the example described here, M=128, which makes it possible to obtain 2560 samples over a recording period of 128 ns.

The acquisition that has just been described is for example achieved over a period precisely equal to the abovementioned recording period. It is possible however, as a variant, to have the acquisition operate over a period longer than the recording period, in which case only last samples are obtained (relative to the recording period preceding the stopping of the acquisition, with loss of the earlier samples), which allows the use of the device in pre-triggering.

The end of the acquisition phase is achieved by stopping the clocks $H_0$ and $H_1$, which freezes the content of the memory.

Note that, in order to comply with the Shannon criterion, the track-and-hold units $14_1, \ldots, 14_N$ must have a bandwidth of at least $F_e/2$ (namely in this instance 10 GHz) and the analog memories must have a bandwidth of at least $f_e/2$ (namely in this instance 500 MHz). Preferably memories having a bandwidth close to this minimum will be chosen in order to preserve the dynamic range of the signal as much as possible.

The third stage comprises a plurality of analog-digital converters $32_1, \ldots, 32_N$, a converter $32_i$ being in this instance associated with the output of each memory $20_i$ (that is to say with an element of the last line $29_1, \ldots, 29_N$ of the matrix memory formed by these memories).

The converters have, for example, a large dynamic range (10 bits or more, in this instance 12 bits), made in CMOS technology.

The values stored in each analog memory $20_i$ are successively read and converted by the associated converter $32_i$ by the continuing of the sequential shift in each analog memory 20 (that is to say of the shift from line to line of the matrix memory), this time however at a much slower rate, in this instance 5 MHz, for example by means of the application to the analog memories $20_1, \ldots, 20_N$ and to the converters $32_1, \ldots, 32_N$ of a clock $H_1'$ at this frequency.

It is moreover even envisageable as a variant to use a single analog-digital converter to read and convert all of the analog values stored in the matrix memory, provided however that switching means are provided allowing this single converter to gain access to the various columns of the matrix memory during the hold time of the samples in the analog memories (typically a few microseconds).

The digitized values are then stored in a digital memory 34 (or, as a variant, transmitted to a digital processor through a dedicated bus).

Figure 2:
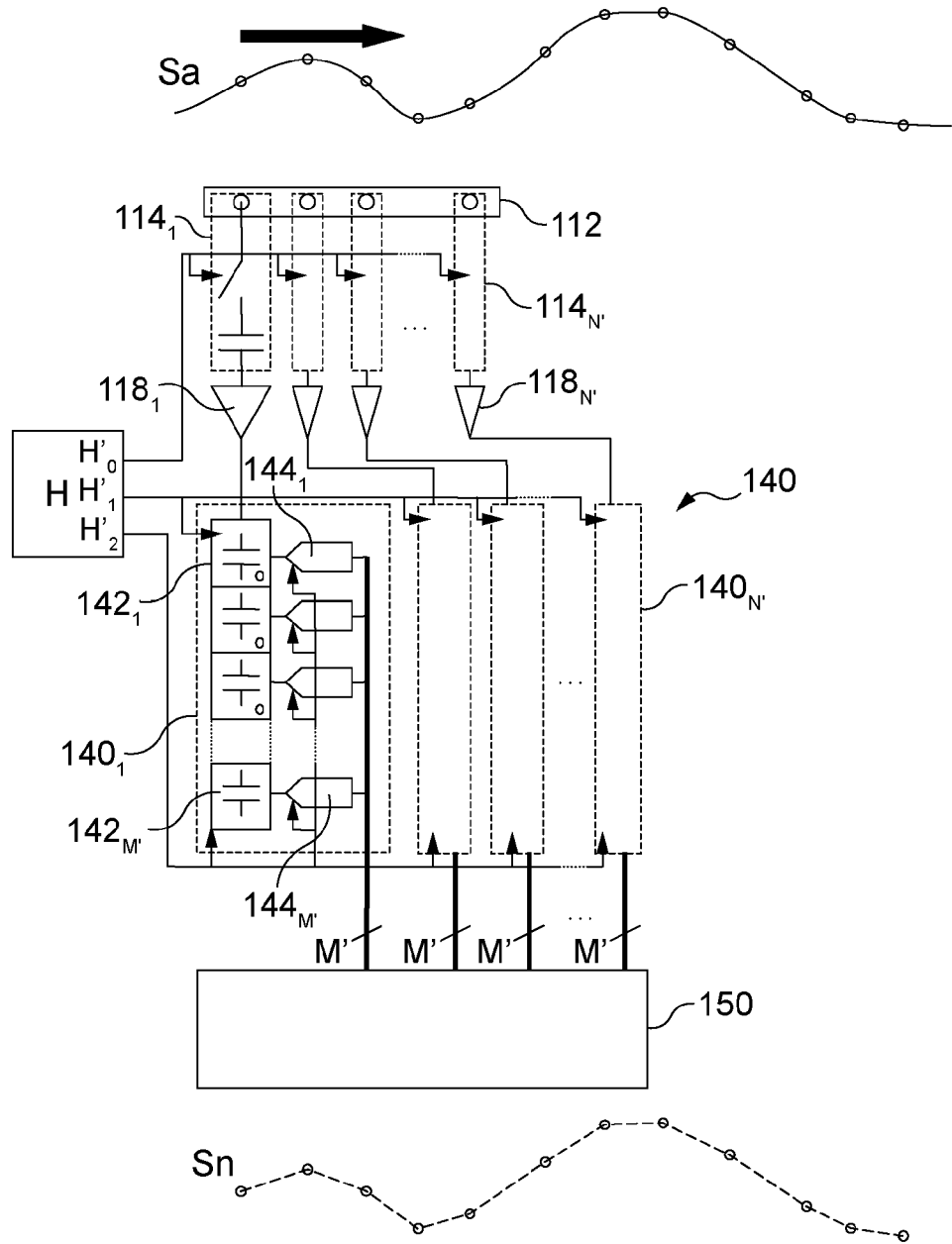
FIG. 2 represents a digitizer according to a second embodiment of the invention.

A second embodiment of the invention will now be described with reference to FIG. 2. The elements common to this second embodiment and to the first embodiment described above are shown in FIG. 2 with a reference increased by 100 relative to that used in FIG. 1 and will not be described in detail.

N' track-and-hold units $114_1, \ldots, 114_{N'}$ are connected at regular intervals to a line of propagation 112 so as to sample the electric signal that travels over this line. The sampling of each track-and-hold unit $114_i$ is triggered by application of a clock $H'_0$ with a frequency $f'_e$. The same parameters as in the first embodiment are used here by way of example, namely N'=40 and $f'_e$=1 GHz.

The values read by each track-and-hold unit $114_i$ are transmitted (for example through an amplifier $118_i$) to the first element $142_1$ of a column $140_i$ associated with this track-and-hold unit $114_i$ within an analog matrix memory 140 formed of M' lines. In the example described here, M'=5.

The values stored by the analog memory 140 are shifted from line to line (that is to say, for each element $142_i$, to the element $142_{i+1}$) by application of a clock $H'_1$, also with a frequency $f'_e$.

The analog memory 140 also comprises analog-digital converters $144_i$, each associated with a memory element $142_i$. The converters are preferably integrated, for example in CMOS technology, which makes it possible to obtain acceptable power consumption despite the large number of converters in operation.

The analog memory 140 is also addressable so as to allow the reading (and the conversion to digital) of the samples already present in memory at the same time as the recording of the following samples. Memories of this type are for example described in U.S. Pat. No. 6,091,619 and French Patent No. 2 872 331.

The converters $144_i$ are controlled by a clock $H'_2$ of frequency $f'_e$/M', namely in this instance 200 MHz, which makes it possible to read (and to convert to digital) on each cycle of this clock $H'_2$ all of the (analog) values stored in the M' lines of the memory 140.

The values read and digitized are transmitted (for example by means of buses $145_1, \ldots, 145_{N'}$) to a digital memory 150 for storage.

This gives a continuous digitization and recording of the electric signal.

Figure 3:
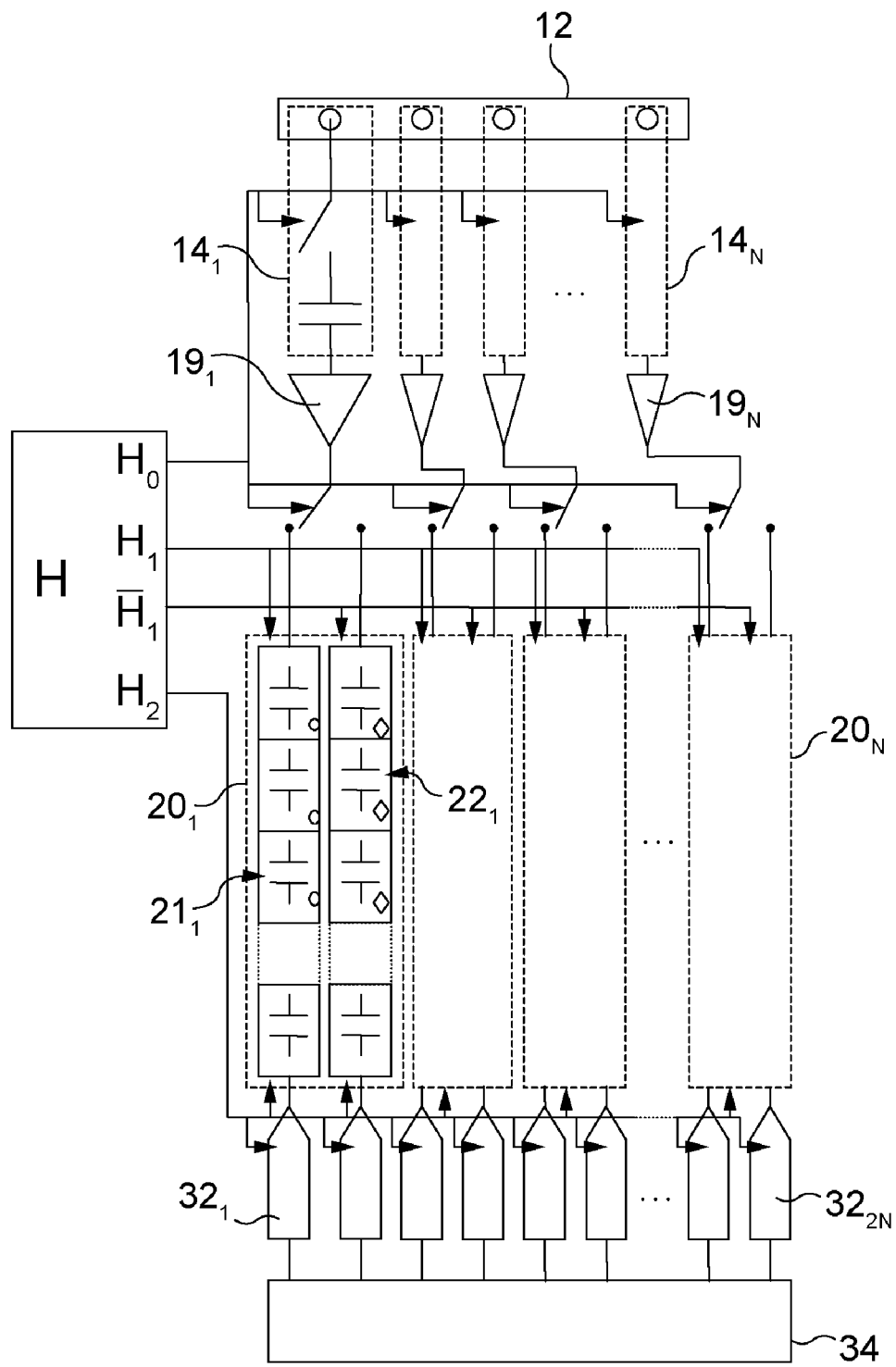
FIG. 3 represents a digitizer according to a third embodiment of the invention.

FIG. 3 shows a third embodiment in which the amplifiers $18_1, \ldots, 18_N$ of FIG. 1 are replaced by differential amplifiers $19_1, \ldots, 19_N$ the two outputs of which are used alternately, which makes it possible to divide by two the length of the line of propagation used. To obtain the same results as in the example described above with reference to FIG. 1, it is therefore possible in this instance to take N=20.

Because of the closeness of the embodiments, FIG. 3 uses reference numbers that are identical to those of FIG. 1 and only the operating aspects specific to the variant of FIG. 3 are described below.

Each differential amplifier $19_i$ is connected to an associated track-and-hold unit $14_i$ (triggered by a clock $H_0$ at frequency $f_e$, in this instance equal to 2 GHz if it is desired to obtain an acquisition frequency of the system of 40 GHz as before), but applies alternately the sampled signal to a first column $21_i$ and to a second column $22_i$ of a portion $20_i$ of memory associated with this track-and-hold unit $14_i$, in this instance by the application of the clock $H_0$ to the output switch of the differential amplifier $19_i$. Each column $21_i$, $22_i$ therefore receives analog values to be stored at a frequency $f_e/2$ (in this instance 1 GHz).

The shift is therefore controlled in each of the first columns $21_1, \ldots, 21_N$ (by means of the clock $H_1$ with a frequency $f_e/2$) in phase opposition relative to the shift within the second columns $22_1, \ldots, 22_N$ (controlled by clock $\overline{H_1}$).

Once the acquisition phase that has just been described is finished (because all of the elements of each column $21_i$, $22_i$ are full), the content of all these elements is read and digitized, for example by means of converters $32_1, \ldots, 32_{2N}$ each associated with a column $21_i$, $22_i$ and controlled by a clock $H_2$ at a relatively low frequency (in this instance 5 MHz), so that they can be stored in the digital memory 34.

The foregoing embodiments are only exemplary embodiments of the invention which is not limited thereto. Notably, the use of two outputs of differential amplifiers, described above as a variant of the first embodiment, could equally apply to the second embodiment.

The invention claimed is:

1. A device for digitizing an electric signal, the device comprising:
    a line of propagation over which the signal travels;
    a plurality of track-and-hold units connected at distinct points of the line of propagation so that each unit samples the value of the signal at a connection point;
    an analog matrix memory comprising a line of which at least certain elements are each connected to a track-and-hold unit so as to receive and store the value sampled by the track-and-hold unit, and
    means for line-to-line shifting of the stored values; and
    analog-digital conversion means for converting the stored values.

2. The digitizing device according to claim 1, wherein the analog-digital conversion means comprise a plurality of analog-digital converters.

3. The digitizing device according to claim 2, wherein the analog-digital converters are each connected to a column of the analog matrix memory.

4. The digitizing device according to claim 2, wherein an analog-digital converter is associated with each element of the analog matrix memory.

5. A digitizing device according to claim 4, wherein the analog-digital converters are incorporated into the analog matrix memory.

6. The digitizing device according to claim 4 or 5 further comprising means for controlling the line-to-line shifting at a determined frequency and means for controlling the converters at a frequency equal to the determined frequency divided by a number of elements in a column in the analog memory.

7. The digitizing device according to one of claim 1, wherein at least one of the plurality of track-and-hold units is connected to the analog memory by means of a differential amplifier so as to alternately apply a sampled value to a first column and to a second column of the analog matrix memory.

8. The digitizing device according to one claim 1, wherein the plurality of track-and-hold units comprise InP components.

9. The digitizing device according to claim 1, wherein the analog matrix memory comprises CMOS components.

10. The digitizing device according to one claim 1 wherein the plurality of track-and-hold units comprises 10 to 100 track-and-hold units.

11. The digitizing device according to claim 1 further comprising a clock that generates and applies a signal to the track and hold units so as simultaneously sample N samples of the value of the signal by N tack-and-hold units.

12. A device for digitizing an electric signal, the device comprising:
    a line of propagation over which the signal travels;
    a plurality of track-and-hold units connected at distinct points of the line of propagation so that each unit samples the value of the signal at a connection point;

an analog matrix memory comprising a line of which at least certain elements are each connected to a track-and-hold unit so as to receive and store the value sampled by the track-and-hold unit, and a clock coupled to the matrix memory that applies a signal to the memory for line-to-line sequential shifting of the stored values; and analog-digital conversion means for converting the stored values.

13. The digitizing device according to claim 12, wherein the clock signal controls the line-to-line shifting at a determined frequency and wherein the clock generates signals for controlling the converters at a frequency equal to the determined frequency divided by a number of elements in a column in the analog memory.

* * * * *